United States Patent
Wang et al.

(10) Patent No.: US 10,727,442 B2
(45) Date of Patent: Jul. 28, 2020

(54) ORGANIC LIGHT-EMITTING DISPLAY APPARATUS INCLUDING AN ENCAPSULATING LAYER HAVING ISLANDS

(71) Applicant: Samsung Display Co., Ltd., Yongin-si, Gyeonggi-do (KR)

(72) Inventors: Seongmin Wang, Yongin-si (KR); Taekyung Kim, Yongin-si (KR); Ohjune Kwon, Yongin-si (KR); Mugyeom Kim, Yongin-si (KR); Yoonhyeung Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 6 days.

(21) Appl. No.: 14/836,062

(22) Filed: Aug. 26, 2015

(65) Prior Publication Data
US 2016/0126496 A1 May 5, 2016

(30) Foreign Application Priority Data

Nov. 3, 2014 (KR) .......................... 10-2014-0151585

(51) Int. Cl.
*H01L 51/52* (2006.01)
*H01L 51/50* (2006.01)
(Continued)

(52) U.S. Cl.
CPC ...... *H01L 51/5256* (2013.01); *H01L 27/3211* (2013.01); *H01L 51/0097* (2013.01);
(Continued)

(58) Field of Classification Search
CPC .................. H01L 51/5256; H01L 27/3211
(Continued)

(56) References Cited

U.S. PATENT DOCUMENTS 6,594,916 B2   7/2003   Boroson et al.
9,515,291 B2 * 12/2016   Kudo .................... H01L 27/322
(Continued)

FOREIGN PATENT DOCUMENTS

CN   104124258 A   10/2014
EP   2 608 288   6/2013
(Continued)

OTHER PUBLICATIONS

Extended European Search Report dated Mar. 23, 2016 in corresponding European Patent Application No. 15191679.8.
(Continued)

*Primary Examiner* — Lex H Malsawma
*Assistant Examiner* — Eric W Jones
(74) *Attorney, Agent, or Firm* — Lewis Roca Rothgerber Christie LLP

(57) ABSTRACT

An organic light-emitting display apparatus includes: a substrate; first electrodes arranged on the substrate at separate positions; a second electrode disposed on the first electrodes to face the first electrodes; an intermediate layer disposed between the first electrodes and the second electrode and including an emission layer; a first encapsulating layer disposed on the second electrode and patterned to have a plurality of islands, the first encapsulating layer including an organic material; and a second encapsulating layer covering the islands of the first encapsulating layer and including an inorganic material.

14 Claims, 9 Drawing Sheets

(51) Int. Cl.
  *H01L 27/32*   (2006.01)
  *H01L 51/00*   (2006.01)

(52) U.S. Cl.
  CPC ...... *H01L 51/5012* (2013.01); *H01L 51/5206* (2013.01); *H01L 51/5221* (2013.01); *H01L 51/5253* (2013.01); *H01L 51/5275* (2013.01); *H01L 2251/5338* (2013.01)

(58) Field of Classification Search
  USPC .................................................... 257/40, 59
  See application file for complete search history.

(56) References Cited

U.S. PATENT DOCUMENTS

| | | | |
|---|---|---|---|
| 9,577,014 B2* | 2/2017 | Ishii | H01L 27/3246 |
| 2001/0026835 A1* | 10/2001 | Tanaka | H01L 21/2026 |
| | | | 438/149 |
| 2001/0028223 A1 | 10/2001 | Kimura | |
| 2006/0060870 A1* | 3/2006 | Park | H01L 27/322 |
| | | | 257/88 |
| 2007/0090350 A1* | 4/2007 | Lee | H01L 27/322 |
| | | | 257/40 |
| 2008/0211399 A1 | 9/2008 | Ryuji et al. | |
| 2010/0327297 A1* | 12/2010 | Yoshida | H01L 27/3211 |
| | | | 257/89 |
| 2011/0233570 A1* | 9/2011 | Lee | H01L 51/5253 |
| | | | 257/88 |
| 2011/0284898 A1* | 11/2011 | Iwasaki | H01L 27/322 |
| | | | 257/98 |
| 2012/0038267 A1* | 2/2012 | Hanamura | H01L 27/322 |
| | | | 313/504 |
| 2012/0104367 A1* | 5/2012 | Hasegawa | H01L 27/3211 |
| | | | 257/40 |
| 2012/0104368 A1 | 5/2012 | Isobe et al. | |
| 2012/0109117 A1 | 5/2012 | Lee et al. | |
| 2013/0002133 A1* | 1/2013 | Jin | G09F 9/33 |
| | | | 313/511 |
| 2014/0034919 A1 | 2/2014 | Park et al. | |
| 2014/0062292 A1* | 3/2014 | Seong | H01L 51/5253 |
| | | | 313/504 |
| 2014/0124767 A1 | 5/2014 | Maindron et al. | |
| 2014/0319474 A1 | 10/2014 | Kim et al. | |
| 2014/0339509 A1* | 11/2014 | Choi | H01L 51/5275 |
| | | | 257/40 |
| 2014/0361261 A1* | 12/2014 | Choi | H01L 51/5218 |
| | | | 257/40 |
| 2014/0361264 A1* | 12/2014 | Choi | H01L 51/5275 |
| | | | 257/40 |

FOREIGN PATENT DOCUMENTS

| | | |
|---|---|---|
| JP | 2001-287395 | 10/2001 |
| JP | 2012-109213 | 6/2012 |
| JP | 2012-109214 | 6/2012 |
| KR | 10-2005-0016738 | 2/2005 |
| KR | 10-2006-0114086 | 11/2006 |
| KR | 10-2014-0018548 | 2/2013 |
| KR | 10-2013-0046662 | 5/2013 |
| KR | 10-2013-0067460 | 6/2013 |
| KR | 10-2014-0118222 A | 10/2014 |

OTHER PUBLICATIONS

Chinese Office Action dated Feb. 26, 2020, for corresponding Chinese Patent Application No. 201510736880.3 (8 pages).

* cited by examiner

ORGANIC LIGHT-EMITTING DISPLAY APPARATUS INCLUDING AN ENCAPSULATING LAYER HAVING ISLANDS

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of Korean Patent Application No. 10-2014-0151585, filed on Nov. 3, 2014, in the Korean Intellectual Property Office, the disclosure of which is incorporated herein in its entirety by reference.

BACKGROUND

Field

One or more embodiments relate to a durable and convenient organic light-emitting display apparatus.

Description of the Related Technology

Recent display apparatuses are used for various purposes, and owing to the development of slim and light display apparatuses, the use of display apparatuses has increased in more applications. Particularly, along with the rapid growth of the wearable device market, flexible display apparatuses have been actively developed.

Flexible display apparatuses are bendable or flexible and thus may be conveniently used. Properties of substrates and various thin films of such flexible display apparatuses may have to be adjusted for guaranteeing the flexibility of the flexible display apparatuses.

Typical display apparatuses do not have satisfactory flexibility, and if the display apparatuses are repeatedly used, the lifespans thereof are generally sharply decreased.

SUMMARY OF CERTAIN INVENTIVE ASPECTS

One or more embodiments include a durable and convenient organic light-emitting display apparatus. However, the embodiments of the present disclosure are not limited thereto.

Additional aspects will be set forth in part in the description which follows and, in part, will be apparent from the description, or may be learned by practice of the presented embodiments.

According to one or more embodiments, an organic light-emitting display apparatus includes: a substrate; first electrodes arranged separate from one another on the substrate; a second electrode disposed above the first electrodes to face the first electrodes; an intermediate layer disposed between the first electrodes and the second electrode and including an emission layer; a first encapsulating layer disposed on the second electrode and patterned to have a plurality of islands, the first encapsulating layer including an organic material; and a second encapsulating layer covering the islands of the first encapsulating layer and including an inorganic material.

The islands of the first encapsulating layer may correspond to the first electrodes. The first electrodes may include first color sub-pixel electrodes, second color sub-pixel electrodes, and third color sub-pixel electrodes, wherein islands of the first encapsulating layer corresponding to the first color sub-pixel electrodes may have a first radius of curvature, islands of the first encapsulating layer corresponding to the second color sub-pixel electrodes may have a second radius of curvature, and islands of the first encapsulating layer corresponding to the third color sub-pixel electrodes may have a third radius of curvature.

According to one or more embodiments, an organic light-emitting display apparatus includes: a substrate; first electrodes arranged separate from one another; a second electrode disposed above the first electrodes to face the first electrodes; an intermediate layer disposed between the first electrodes and the second electrode and including an emission layer; a first encapsulating layer disposed on the second electrode, wherein a portion of the first encapsulating layer corresponding to a first region of the substrate is patterned to have a plurality of islands, and a portion of the first encapsulating layer corresponding to a second region of the substrate is formed as one body; and a second encapsulating layer covering the first encapsulating layer.

The first encapsulating layer may include an organic material, and the second encapsulating layer may include an inorganic material.

The substrate may be a bendable substrate including a bending region, and the first region may correspond to the bending region.

The substrate may be a flexible substrate, and the first region may include a center of the substrate. The substrate may include a long axis and a short axis, and the first region may include the center of the substrate and may extend along the short axis of the substrate.

Both sides of the substrate may have a rectangular shape including first edges extending in a first direction and second edges extending in a second direction perpendicular to the first direction, wherein the first region may include: a first portion including the center of the substrate and extending in a direction parallel to the first edges; and a second portion including the center of the substrate and extending in a direction parallel to the second edges.

The first region may include an edge of the substrate.

The first region may correspond to an edge of the substrate. The substrate may be circular shaped.

The second encapsulating layer may be formed as one body.

The organic light-emitting display apparatus may further include a third encapsulating layer covering the second encapsulating layer and including an organic material.

The islands of the first encapsulating layer may correspond to the first electrodes in the first region. The first electrodes may include first color sub-pixel electrodes, second color sub-pixel electrodes, and third color sub-pixel electrodes, wherein islands of the first encapsulating layer corresponding to the first color sub-pixel electrodes may have a first radius of curvature, islands of the first encapsulating layer corresponding to the second color sub-pixel electrodes may have a second radius of curvature, and islands of the first encapsulating layer corresponding to the third color sub-pixel electrodes may have a third radius of curvature.

BRIEF DESCRIPTION OF THE DRAWINGS

These and/or other aspects will become apparent and more readily appreciated from the following description of certain embodiments, taken in conjunction with the accompanying drawings in which.

DETAILED DESCRIPTION OF CERTAIN INVENTIVE EMBODIMENTS

Figure 1:
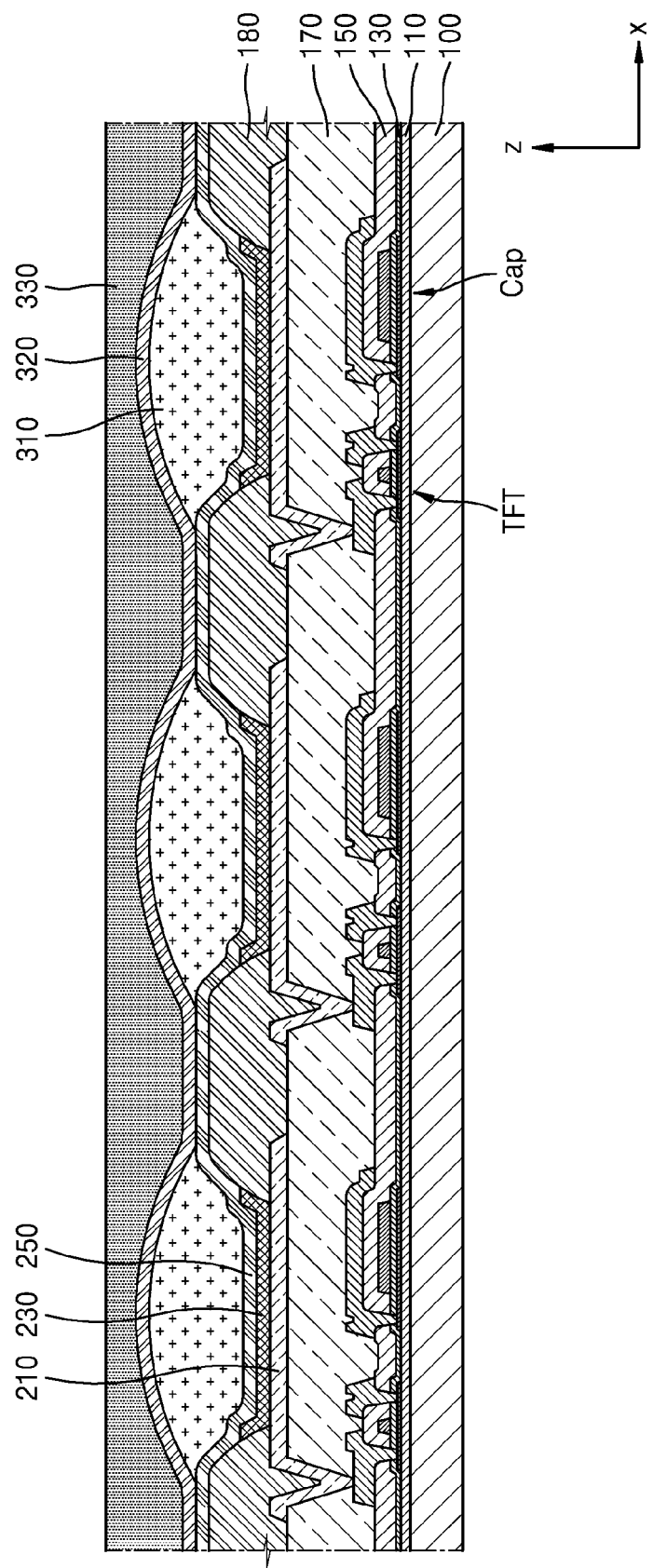
FIG. 1 is a schematic cross-sectional view illustrating a portion of an organic light-emitting display apparatus according to an embodiment.

Reference will now be made in detail to certain embodiments, examples of which are illustrated in the accompanying drawings. Effects and features of the embodiments, and implementation methods thereof will be clarified through the following descriptions given with reference to the accompanying drawings. In this regard, the embodiments may have different forms and should not be construed as being limited to the descriptions set forth herein. As used herein, the term "and/or" includes any and all combinations of one or more of the associated listed items.

Hereinafter, the embodiments will be described in detail with reference to the accompanying drawings. In the drawings, like reference numerals generally denote like elements, and overlapping descriptions thereof will be omitted.

It will be understood that when a layer, a film, a region, or a plate is referred to as being "on" or "above" another layer, film, region, or plate, it can be directly on the other layer, film, region, or plate, or intervening layers, films, regions, or plates may also be present. In addition, sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic cross-sectional view illustrating a portion of an organic light-emitting display apparatus according to an embodiment.

Referring to FIG. 1, the organic light-emitting display apparatus includes a substrate 100, thin-film transistors TFT, capacitors Cap, a buffer layer 110, a gate insulating layer 130, an interlayer insulating layer 150, a planarization layer 170, first electrodes 210, an intermediate layer 230, a second electrode 250, a first encapsulating layer 310, and a second encapsulating layer 320.

The substrate 100 may be a flexible substrate including a plastic material. However, if the substrate 100 contains a plastic material, moisture or oxygen may more easily permeate the substrate 100 than with a glass substrate, and thus organic light-emitting devices vulnerable to moisture or oxygen may be degraded and shortened in lifespan. To prevent this, the buffer layer 110 having a single-layer or multi-layer structure including a silicon oxide or silicon nitride may be disposed on the substrate 100.

The thin-film transistors TFT and organic light-emitting devices may be disposed on the buffer layer 110. The organic light-emitting devices may include the first electrodes 210, the intermediate layer 230, and the second electrode 250.

The thin-film transistors TFT may include gate electrodes, source electrodes, drain electrodes, and a semiconductor layer. The gate insulating layer 130 may include a silicon oxide or silicon nitride and be disposed between the semiconductor layer and the gate electrodes for insulating the semiconductor layer from the gate electrodes. The interlayer insulating layer 150 may be disposed on the gate electrodes. The interlayer insulating layer 150 may have a single-layer or multi-layer structure including a material such as, for example, a silicon oxide or silicon nitride. However, a material that may be used for forming the interlayer insulating layer 150 is not limited thereto. That is, various materials may be used for forming the interlayer insulating layer 150. This is the same for other elements. The source electrodes and the drain electrodes are formed on the interlayer insulating layer 150. The source electrodes and the drain electrodes are electrically connected to the semiconductor layer through contact holes formed in the interlayer insulating layer 150 and the gate insulating layer 130.

In the thin-film transistors TFT illustrated in FIG. 1, the semiconductor layer forms a lowermost layer, the gate electrodes are formed above the semiconductor layer, and the source electrodes and the drain electrodes form an uppermost layer. However, the thin-film transistors TFT may have a different structure. The semiconductor layer may include a poly-silicon layer, an amorphous silicon layer, an organic semiconductor layer, or a conductive oxide semiconductor layer.

A protective layer or the planarization layer 170 may be disposed on the source electrodes and the drain electrodes so as to protect or flatten the lower thin-film transistors TFT. The protective layer or the planarization layer 170 may be formed by various methods. For example, the protective layer or the planarization layer 170 may include an organic material such as, for example, benzocyclobutene (BCB) or acrylic, or an inorganic material such as, for example, a silicon oxide or silicon nitride. The protective layer or the planarization layer 170 may have a single-layer structure, a double-layer structure, or a multi-layer structure.

The organic light-emitting devices may be disposed on the protective layer or the planarization layer 170. The organic light-emitting devices include the first electrodes 210 as pixel electrodes, the second electrode 250 as an opposite electrode facing the first electrodes 210, and the intermediate layer 230 including at least an emission layer, and disposed between the first electrodes 210 and the second electrode 250. A pixel defining layer 180 covers the first electrodes 210 except for regions including center regions of the first electrodes 210 so that the first electrodes 210 may be exposed through the regions.

The first electrodes 210 being pixel electrodes are anodes, and the second electrode 250 being an opposite electrode is a cathode. However, the polarities of the first electrodes 210 (pixel electrodes) and the second electrode 250 (opposite electrode) may be opposite to this configuration in other embodiments.

The first electrodes 210 may be transparent or reflective electrodes. If the first electrodes 210 are transparent electrodes, the first electrodes 210 may include, for example, ITO, IZO, ZnO, or $In_2O_3$. If the first electrodes 210 are reflective electrodes, each of the first electrodes 210 may include: a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof; and a ITO, IZO, ZnO, or $In_2O_3$ layer formed on the reflective layer.

Similarly, the second electrode 250 may be a transparent or reflective electrode. If the second electrode 250 is a transparent electrode, the second electrode 250 may include: a deposition layer facing the first electrodes 210 and including lithium (Li), calcium (Ca), LiF/Ca, LiF/Al, aluminum (Al), magnesium (Mg), or a compound thereof; and auxiliary electrodes or bus electrode lines including a material used to form transparent electrodes such as, for example, ITO, IZO, ZnO, or $In_2O_3$. If the second electrode 250 is a reflective electrode, the second electrode 250 may include a deposition layer including Li, Ca, LiF/Ca, LiF/Al, Al, Mg, or a compound thereof.

The intermediate layer 230 including at least an emission layer is disposed between the first electrodes 210 and the second electrode 250. The intermediate layer 230 may include a low molecular organic material or a high molecular organic material.

If the intermediate layer 230 includes a low molecular organic material, the intermediate layer 230 may have a stacked structure including a hole injection layer (HIL), an organic emission layer (EML), an electron transport layer (ETL), and an electron injection layer (EIL). In this case, the intermediate layer 230 may include an organic material such as, for example, copper phthalocyanine (CuPc), N,N'-Di (naphthalene-1-yl)-N,N'-diphenyl-benzidine (NPB), or tris-8-hydroxyquinoline aluminum (Alq3). The layers including a low molecular organic material may be formed by a method such as a vacuum deposition method using masks, for example.

If the intermediate layer 230 includes a high molecular organic material, the intermediate layer 230 may have a structure including a hole transport layer (HTL) and an emission layer (EML). In this case, the hole transport layer may include PEDOT, and the emission layer may include a high molecular organic material such as, for example, a poly-phenylenevinylene (PPV)-containing organic material or a polyfluorene-containing organic material.

The intermediate layer 230 including an emission layer may emit red, green, or blue light. A sub-pixel may be a region capable of emitting red, green, or blue light, and in this case, a group constituted by three sub-pixels may form a pixel. In another example, a sub-pixel may emit light having a color other than red, green, and blue. That is, a pixel may be constituted by a plurality of sub-pixels emitting light of different colors as long as the pixel may emit white light. In another example, all sub-pixels may emit white light, and light emitted from the sub-pixels may pass through a color conversion layer or color filters.

In FIG. 1, the intermediate layer 230 is illustrated as being patterned to correspond to the first electrodes 210. This is for illustrative purposes only. For example, a layer of the intermediate layer 230, such as a hole injection layer, may be formed as one body to substantially correspond to an entire surface of the substrate 100, and another layer of the intermediate layer 230, such as an emission layer, may be patterned to correspond to the first electrodes 210.

The organic light-emitting devices are arranged on the substrate 100, and the first electrodes 210 are accordingly arranged on the substrate 100. The second electrode 250 is formed as one body in a display region to correspond to the first electrodes 210.

The first encapsulating layer 310 is formed on the second electrode 250. As shown in FIG. 1, the first encapsulating layer 310 is patterned to form a plurality of islands separate from each other. The first encapsulating layer 310 includes an organic material. The second encapsulating layer 320 includes an inorganic material and covers the islands of the first encapsulating layer 310. The second encapsulating layer 320 may cover almost all of the area of the substrate 100 and may be formed as one body. If necessary, a third encapsulating layer 330 including an organic material may be formed to cover the second encapsulating layer 320. For example, the first encapsulating layer 310 may include polyethylene terephthalate, polyethylene naphthalate, polycarbonate, polyimide, polyethylene sulfonate, polyoxymethylene, and/or polyarylate. The second encapsulating layer 320 may include a silicon oxide, silicon nitride, or aluminum oxide.

The first encapsulating layer 310 and the second encapsulating layer 320 are thin-film encapsulating layers for protecting the organic light-emitting devices from impacts or impurities.

In an organic light-emitting display apparatus, a thin-film encapsulating layer may be formed by alternately forming inorganic and organic layers. Such a thin-film encapsulating layer may be formed on the entirety of a surface of a panel by a deposition method. If a panel of a flexible display apparatus on which a thin-film encapsulating layer is entirely formed without any discontinuous portions as described above is twisted or bent, although the thickness of the thin-film encapsulating layer is small as compared with the thickness of the flexible display apparatus, a region of the thin-film encapsulating layer in which stress is concentrated is frequently cracked. Moreover, if cracks grow, the durability of the panel may be markedly affected.

However, in the organic light-emitting display apparatus of the disclosed embodiment, the first encapsulating layer 310 disposed on the second electrode 250 is patterned in the form of a plurality of separate islands. Although the first encapsulating layer 310 patterned in the form of separate islands is twisted or bent in any direction by applying any amount of force, each island having a small size may not be readily cracked. In addition, although cracks are formed in some of the islands of the first encapsulating layer 310, the cracks do not propagate to neighboring islands. Therefore, according to the described embodiment, the generation of defects may be easily prevented in manufacturing processes of the organic light-emitting display apparatus, and thin-film encapsulation durable to bending or twisting may be guaranteed in the organic light-emitting display apparatus. Therefore, the organic light-emitting display apparatus may have high flexibility.

In addition, since the first encapsulating layer 310 including an organic material is patterned in the form of separate islands, when structures such as the substrate 100 are bent, stress generated in the thin-film encapsulating layers are absorbed in the first encapsulating layer 310. As a result, when the substrate 100 is bent, the second encapsulating layer 320 covering the first encapsulating layer 310 may be subjected to less stress. Therefore, the second encapsulating layer 320 including an inorganic material may not be damaged or may be less damaged.

The first encapsulating layer 310 may be easily patterned in the form of separate islands by a method such as an inkjet printing. That is, the first encapsulating layer 310 may be easily patterned in the form of separate islands by dotting the second electrode 250 with a monomer at separate positions by an inkjet printing method, and curing the monomer. In this case, the upper surface of the second electrode 250 may be hydrophobically-treated, for example, through a plasma process, so as to prevent dots formed by inkjet printing from spreading and meeting each other.

As shown in FIG. 1, since the islands of the first encapsulating layer 310 correspond to the first electrodes 210, the flexibility of the organic light-emitting display apparatus may be markedly improved, and durable thin-film encapsulation may be realized. In the organic light-emitting display apparatus, since the first electrodes 210, which are pixel electrodes, are formed by performing a patterning process in units of sub-pixels, the first electrodes 210 are not highly flexible. Therefore, the first encapsulating layer 310 may be patterned in units of sub-pixels (that is, the first encapsulating layer 310 may be patterned to correspond to the first electrodes 210) so as to maximize the flexibility of the organic light-emitting display apparatus. In addition, since the first encapsulating layer 310 is patterned, although the organic light-emitting display apparatus is bent, the formation of cracks in the first encapsulating layer 310 may be prevented or markedly reduced. This will be the same in the embodiments and modification examples described below.

Figure 2:
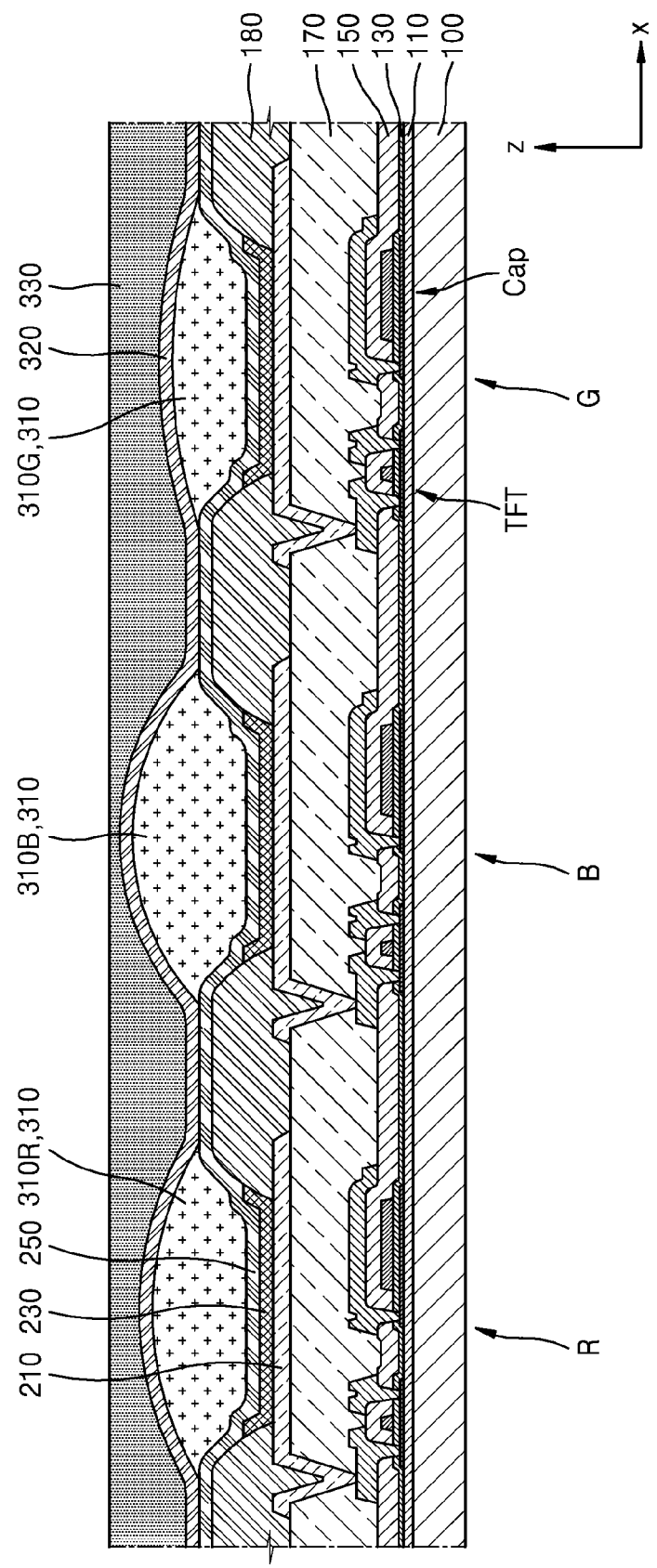
FIG. 2 is a schematic cross-sectional view illustrating a portion of an organic light-emitting display apparatus according to another embodiment.

FIG. 2 is a schematic cross-sectional view illustrating a portion of an organic light-emitting display apparatus according to another embodiment. In the organic light-emitting display apparatus of FIG. 2, the shape of a first encapsulating layer 310 is different from the shape of the first encapsulating layer 310 of the organic light-emitting display apparatus described with reference to FIG. 1. In the organic light-emitting display apparatus of FIG. 2, a plurality of first electrodes 210 may include first color sub-pixel electrodes, second color sub-pixel electrodes, and third color sub-pixel electrodes. For example, if the organic light-emitting display apparatus includes red sub-pixels R, green sub-pixels G, and blue sub-pixels B, the red sub-pixels R may correspond to the first color sub-pixel electrodes of the first electrodes 210, the green sub-pixels G may correspond to the second color sub-pixel electrodes of the first electrodes 210, and the blue sub-pixels B may correspond to the third color sub-pixel electrodes of the first electrodes 210.

In this case, some islands of the first encapsulating layer 310 corresponding to the first color sub-pixel electrodes may have a first radius of curvature, other islands of the first encapsulating layer 310 corresponding to the second color sub-pixel electrodes may have a second radius of curvature, and the other islands of the first encapsulating layer 310 corresponding to the third color sub-pixel electrodes may have a third radius of curvature. The first to third radii of curvature may be different from one another.

The islands of the first encapsulating layer 310 may be shaped like a convex lens. The islands of the first encapsulating layer 310 corresponding to the first electrodes 210 may be formed to function as convex lenses by using refractive index differences between the first encapsulating layer 310 and a second encapsulating layer 320, so as to improve the light extraction efficiency and front-side brightness of the organic light-emitting display apparatus. In this case, the radii of curvature of the convex lenses may be differently adjusted according to the wavelengths of light emitted from an emission layer so as to improve the light extraction efficiency and brightness of each sub-pixel.

For example, when the same electric signal is applied to a red sub-pixel R, a green sub-pixel G, and a blue sub-pixel B, the optical efficiency of a blue emission layer of the blue sub-pixel B may be lowest, and the optical efficiency of a green emission layer of the green sub-pixel G may be highest. In this case, as shown in FIG. 2, an island 310B of the first encapsulating layer 310 corresponding to the blue sub-pixel B may be formed to have the largest radius of curvature, and an island 310G of the first encapsulating layer 310 corresponding to the green sub-pixel G may be formed to have the smallest radius of curvature. In this manner, although differences between electric signals applied to the red sub-pixel R, the green sub-pixel G, and the blue sub-pixel B are reduced, the degrees of brightness of light emitted from the red sub-pixel R, the green sub-pixel G, and the blue sub-pixel B may be adjusted to be similar to each other. For example, an island 310R of the first encapsulating layer 310 corresponding to the red sub-pixel R may have a radius of curvature of about 27.2 µm, the island 310G of the first encapsulating layer 310 corresponding to the green sub-pixel G may have a radius of curvature of about 17.5 µm, and the island 310B of the first encapsulating layer 310 corresponding to the blue sub-pixel B may have a radius of curvature of about 28.6 µm.

Figure 3:
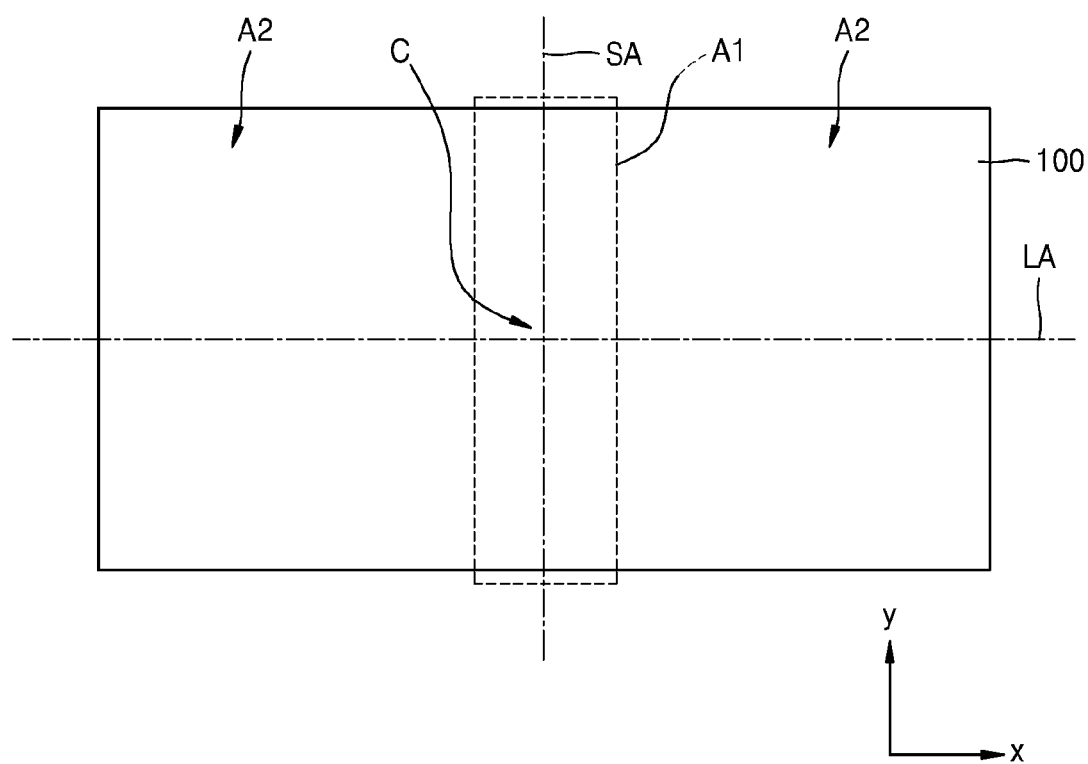
FIG. 3 is a schematic plan view illustrating an organic light-emitting display apparatus according to another embodiment.
Figure 4:
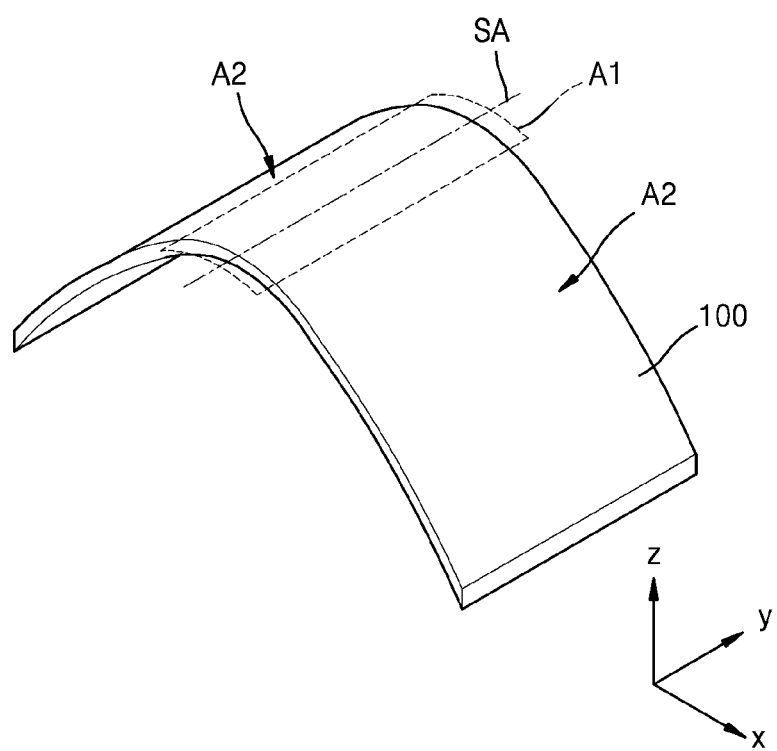
FIG. 4 is a schematic plan view illustrating an example state of the organic light-emitting display apparatus illustrated in FIG. 3.
Figure 5:
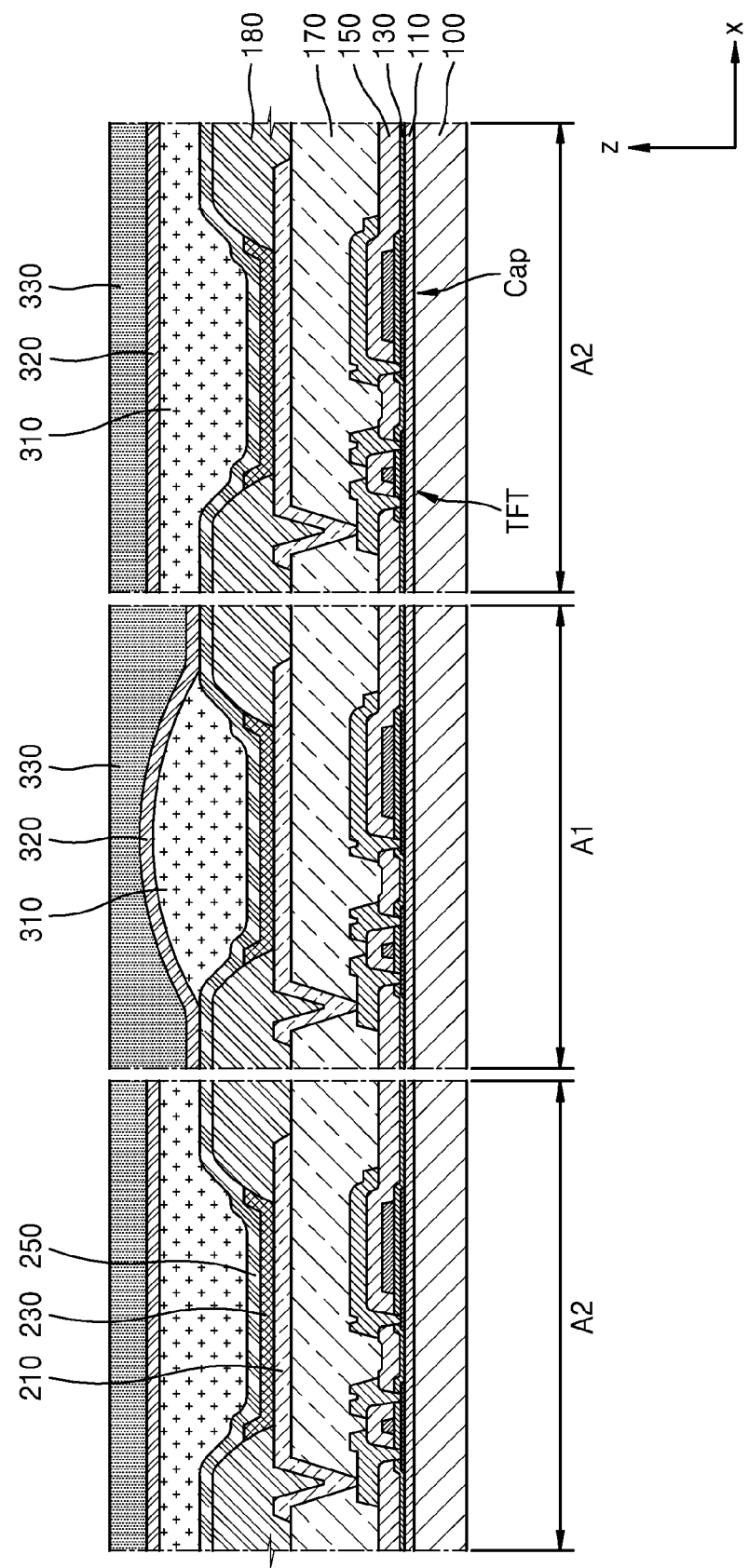
FIG. 5 is a schematic cross-sectional view illustrating a portion of the organic light-emitting display apparatus illustrated in FIG. 3.

FIG. 3 is a schematic plan view illustrating an organic light-emitting display apparatus according to another embodiment. FIG. 4 is a schematic plan view illustrating an example state of the organic light-emitting display apparatus illustrated in FIG. 3, and FIG. 5 is a schematic cross-sectional view illustrating a portion of the organic light-emitting display apparatus illustrated in FIG. 3.

Like the organic light-emitting display apparatus of the previous embodiment described with reference to FIG. 1, the organic light-emitting display apparatus of FIGS. 3-5 includes a substrate 100, a plurality of first electrodes 210 separate from each other, a second electrode 250 disposed above the first electrodes 210 to face the first electrodes 210, an intermediate layer 230 including an emission layer and disposed between the first electrodes 210 and the second electrode 250, a first encapsulating layer 310, and a second encapsulating layer 320. In addition, the organic light-emitting display apparatus may further include a third encapsulating layer 330 as shown in FIG. 5. The first encapsulating layer 310 may include an organic material, and the second encapsulating layer 320 may include an inorganic material.

However, the shape of the first encapsulating layer 310 is different from the shape of the first encapsulating layer 310 of the organic light-emitting display apparatus of the embodiment described with reference to FIG. 1. In the organic light-emitting display apparatus of FIGS. 3-5, a portion of the first encapsulating layer 310 corresponding to a first region A1 of the substrate 100 is patterned in the form of a plurality of islands, and portions of the first encapsulating layer 310 corresponding to second regions A2 of the substrate 100 other than the first region A1 are formed as one body.

As described above, if the first encapsulating layer 310 is patterned in the form of a plurality of islands, although the substrate (flexible substrate) 100 is bent, the first encapsulating layer 310 may not be damaged. For this, a region of the flexible substrate 100 which is mainly bent when the substrate 100 is subjected to bending may be defined as the first region A1, and in the first region A1, the first encapsulating layer 310 may be patterned in the form of a plurality of islands. In the second regions A2 other than the first region A¹, the first encapsulating layer 310 may be formed as one body so as to rapidly manufacture the organic light-emitting display apparatus and reliably protect organic light-emitting devices disposed under the first encapsulating layer 310.

When the flexible substrate 100 is bent, a region around the center C of the substrate 100 may be mostly bent. Therefore, the region A1 may include the center C of the substrate 100.

If the flexible substrate 100 has a long axis LA and a short axis SA as shown in FIG. 3, the organic light-emitting display apparatus may be usually bent around the short axis SA passing through the center C of the substrate 100 as shown in FIG. 4, and thus most bending may occur around the short axis SA passing through the center C of the substrate 100. Therefore, the first region A1 may include the center C of the substrate 100 and may extend along the short axis SA of the substrate 100.

In this case, the first encapsulating layer 310 may be formed as one body in a +x direction from the first region A1 and in an −x display from the first region A1. That is, in the second regions A2, the first encapsulating layer 310 may be divided into two parts. That is, the number of the regions A2 is two, and the first encapsulating layer 310 is continuous in each of the regions A2.

Figure 6:
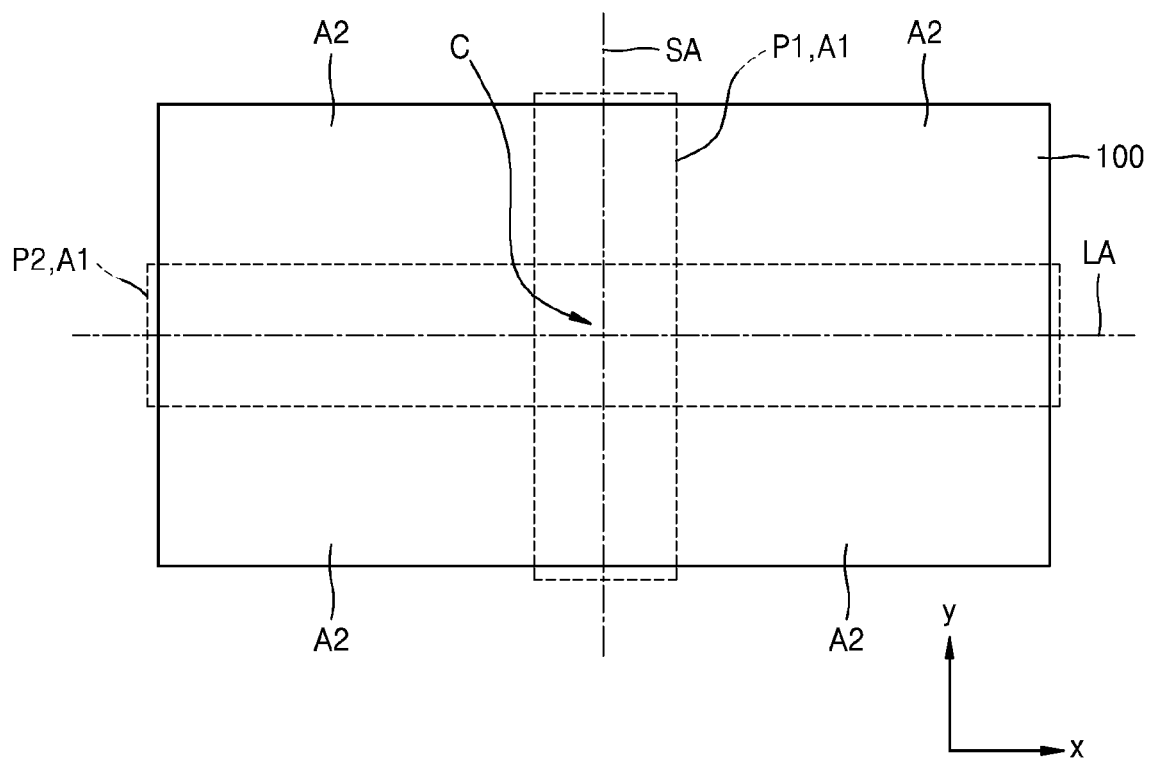
FIG. 6 is a schematic plan view illustrating an organic light-emitting display apparatus according to another embodiment.

Referring to FIG. 6 schematically illustrating an organic light-emitting display apparatus according to another embodiment, a first region A1 may include: a first portion P1 passing through the center C of a substrate 100 and extending along a short axis SA of the substrate 100; and a second portion P2 passing through the center of the substrate 100 and extending along a long axis LA of the substrate 100. That is, the first region A1 may have a + shape. In this case, the substrate 100 may include four second regions A2 divided by the first region A1. A first encapsulating layer 310 may be formed as one body in each of the second regions A2 and may be patterned in the form of a plurality of islands in the first region A1.

In FIG. 6, the substrate 100 has the long axis LA and the short axis SA. However, the embodiments of the present disclosure are not limited thereto. For example, the substrate 100 may have a square shape in a plan view. In any case, both sides of the substrate 100 may have a rectangular shape having two first edges extending in a first direction (+y direction) and two second edges extending in a second direction (+x direction) perpendicular to the first direction. In this case, the first portion P1 of the first region A1 may include the center C of the substrate 100 and extend in parallel with the first edges (in the +y direction), and the second portion P2 of the first region A1 may include the center of the substrate 100 and extend in parallel with the second edges (in the +x direction). That is, the first region A1 may have a + shape.

Figure 7:
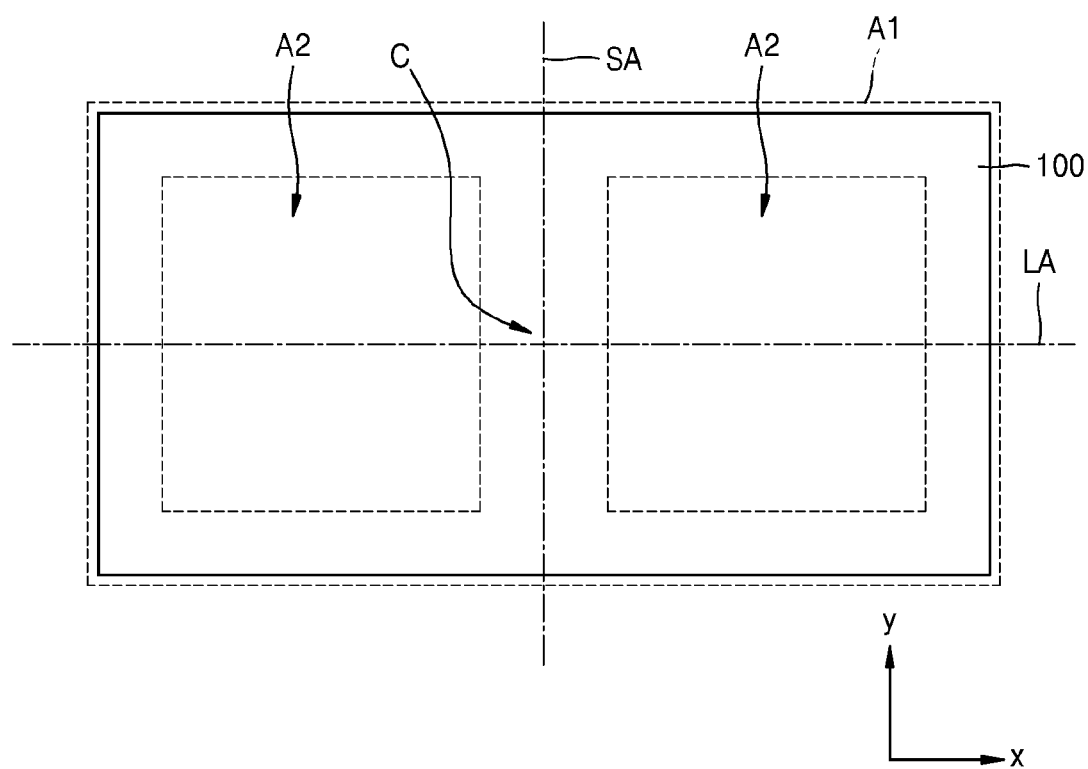
FIG. 7 is a schematic plan view illustrating an organic light-emitting display apparatus according to another embodiment.

The first region A1 may be formed to include edges of the substrate 100. For example, referring to FIG. 7 illustrating a modification example of the organic light-emitting display apparatus illustrated in FIG. 3, a first region A1 may include: a portion including the center C of a substrate 100 and extending in a short axis SA of the substrate 100; and a portion corresponding to edges of the substrate 100. When the substrate 100 is flexible, if the edges of the substrate 100 are not supported by a structure such as a rigid frame, the edges of the substrate 100 may be bent more easily than other portions of the substrate 100 when a force or impactive force is intentionally or not intentionally applied to the substrate 100. Therefore, if the first region A1 includes the edges of the substrate 100, the durability of the organic light-emitting display apparatus may be improved.

Figure 8:
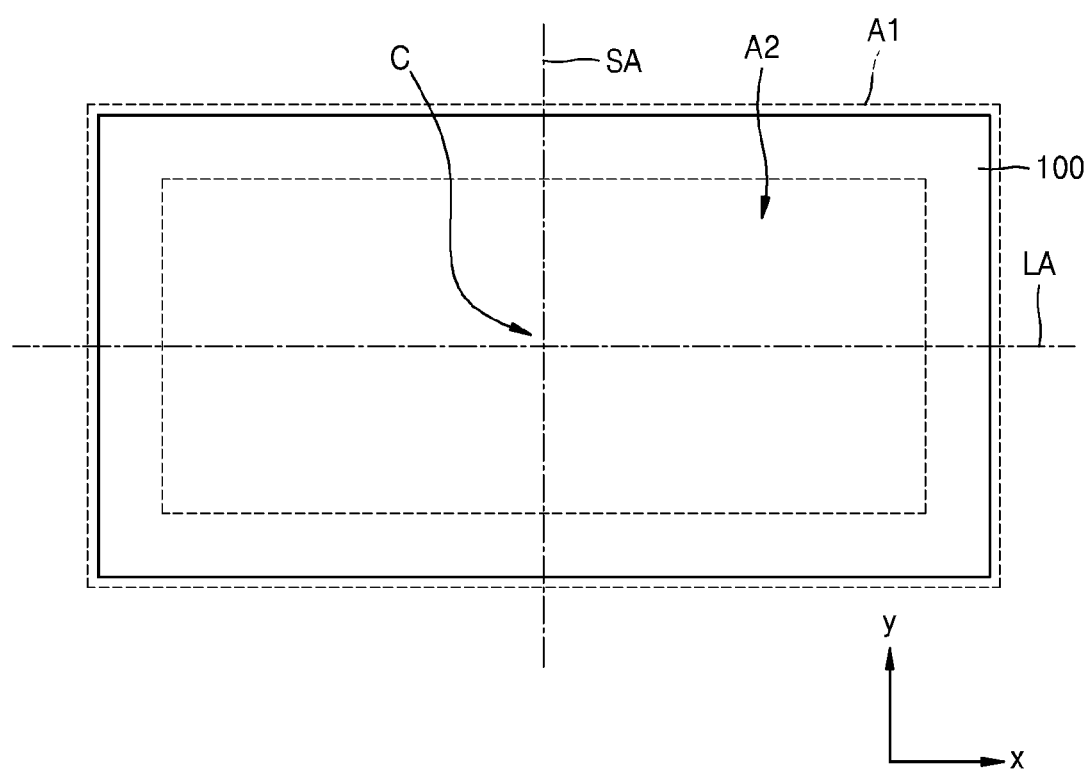
FIG. 8 is a schematic plan view illustrating an organic light-emitting display apparatus according to another embodiment.
Figure 9:
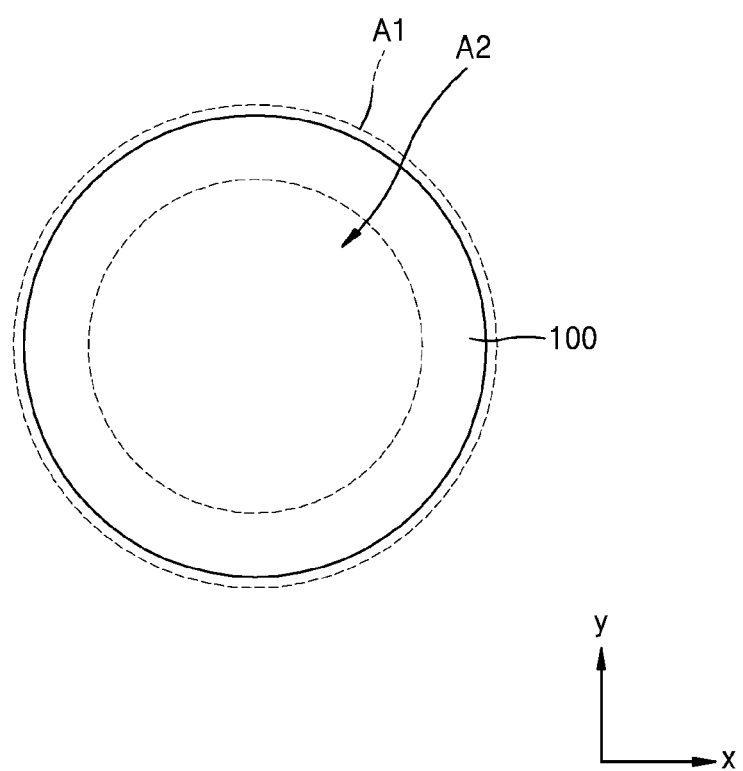
FIG. 9 is a schematic plan view illustrating an organic light-emitting display apparatus according to another embodiment.

FIG. 8 is a schematic plan view illustrating an organic light-emitting display apparatus according to another embodiment. Referring to FIG. 8, a first region A1 may correspond to only edges of a substrate 100. FIG. 9 is a schematic plan view illustrating an organic light-emitting display apparatus according to another embodiment. Referring to FIG. 9, a substrate 100 may have a circular shape instead of a rectangular shape. In this case, a first region A1 may correspond to only the edge of the substrate 100.

In each of the embodiments described with reference to FIGS. 3 to 9, the islands of the first encapsulating layer 310 may correspond to the first electrodes 210 in the first region A1. In addition, as described with reference to FIG. 2, in each of the embodiments described with reference to FIGS. 3 to 9, the islands of the first encapsulating layer 310 may have different radii of curvature according to the wavelengths of light emitted from corresponding sub-pixels. For example, the first electrodes 210 may include first color sub-pixel electrodes, second color sub-pixel electrodes, and third color sub-pixel electrodes. In this case, islands of the first encapsulating layer 310 corresponding to the first color sub-pixel electrodes may have a first radius of curvature, islands of the first encapsulating layer 310 corresponding to the second color sub-pixel electrodes may have a second radius of curvature, and islands of the first encapsulating layer 310 corresponding to the third color sub-pixel electrodes may have a third radius of curvature. The first to third radii of curvature may be different from one another.

In the descriptions of FIGS. 3 to 9, the substrates 100 of the organic light-emitting display apparatuses are flexible. That is, the organic light-emitting display apparatuses are flexible organic light-emitting display apparatuses. However, in other embodiments, a bendable substrate having a bending region may be used. In this case, a first region A1 may correspond to the bending region, and a second region A2 may not correspond to the bending region, as shown in figures.

In the description given above, the first encapsulating layer 310 is disposed on the second electrode 250. However, the embodiments of the present disclosure are not limited thereto. For example, an encapsulating structure including organic and inorganic layers may be formed on the second electrode 250, and the first encapsulating layer 310 may be formed on the encapsulating structure.

As described above, according to the one or more of the above embodiments, the organic light-emitting display apparatus may be durable and convenient to use. However, the embodiments are not limited thereto.

It should be understood that the embodiments described herein should be considered in a descriptive sense only and not for purposes of limitation. Descriptions of features or aspects within each embodiment should typically be considered as available for other similar features or aspects in other embodiments.

While certain embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
   a substrate;
   first electrodes arranged separate from one another on the substrate in a plan view;
   a second electrode disposed above the first electrodes;

an intermediate layer disposed between the first electrodes and the second electrode and comprising an emission layer;

a first encapsulating layer disposed on the second electrode, wherein a first portion of the first encapsulating layer corresponding to a first region of the substrate is patterned to have a plurality of islands separate from one another, and a second portion of the first encapsulating layer corresponding to a second region of the substrate is formed as one body and has a flat uppermost surface, the first portion of the first encapsulating layer is spaced apart and detached from the second portion of the first encapsulating layer, and wherein the first encapsulating layer has a same material throughout the first region and the second region; and a second encapsulating layer covering the first encapsulating layer, wherein the substrate comprises a bend region or a bendable region, the first region corresponds to the bend region or the bendable region, and wherein the first region and the second region are display regions.

2. The organic light-emitting display apparatus of claim 1, wherein the first encapsulating layer comprises an organic material, and the second encapsulating layer comprises an inorganic material.

3. The organic light-emitting display apparatus of claim 1, wherein the substrate is a flexible substrate, and the first region comprises a center of the substrate.

4. The organic light-emitting display apparatus of claim 3, wherein the substrate comprises a long axis and a short axis, and the first region comprises the center of the substrate and extends along the short axis of the substrate.

5. The organic light-emitting display apparatus of claim 3, wherein both sides of the substrate have a rectangular shape comprising first edges extending in a first direction and second edges extending in a second direction perpendicular to the first direction, wherein the first region comprises:
a first portion comprising the center of the substrate and extending in a direction parallel to the first edges; and
a second portion comprising the center of the substrate and extending in a direction parallel to the second edges.

6. The organic light-emitting display apparatus of claim 1, wherein the first region comprises an edge of the substrate.

7. The organic light-emitting display apparatus of claim 1, wherein the first region corresponds to an edge of the substrate.

8. The organic light-emitting display apparatus of claim 7, wherein the substrate is circular shaped.

9. The organic light-emitting display apparatus of claim 1, wherein the second encapsulating layer is formed as one body.

10. The organic light-emitting display apparatus of claim 1, further comprising a third encapsulating layer covering the second encapsulating layer and comprising an organic material.

11. The organic light-emitting display apparatus of claim 1, wherein the islands of the first encapsulating layer correspond to the first electrodes in the first region.

12. The organic light-emitting display apparatus of claim 11, wherein the first electrodes comprise first color sub-pixel electrodes, second color sub-pixel electrodes, and third color sub-pixel electrodes.

13. The organic light-emitting display apparatus of claim 12, wherein islands of the first encapsulating layer correspond to the first color sub-pixel electrodes, the second color sub-pixel electrodes, and the third color sub-pixel electrodes.

14. The organic light-emitting display apparatus of claim 12, wherein islands of the first encapsulating layer corresponding to the first color sub-pixel electrodes have a first radius of curvature, islands of the first encapsulating layer corresponding to the second color sub-pixel electrodes have a second radius of curvature, and islands of the first encapsulating layer corresponding to the third color sub-pixel electrodes have a third radius of curvature.

* * * * *